(12) United States Patent
Vora et al.

(10) Patent No.: US 7,642,566 B2
(45) Date of Patent: Jan. 5, 2010

(54) SCALABLE PROCESS AND STRUCTURE OF JFET FOR SMALL AND DECREASING LINE WIDTHS

(75) Inventors: Madhukar B. Vora, Los Gatos, CA (US); Ashok Kumar Kapoor, Palo Alto, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 0 days.

(21) Appl. No.: 11/451,886

(22) Filed: Jun. 12, 2006

(65) Prior Publication Data
US 2007/0284626 A1    Dec. 13, 2007

(51) Int. Cl.
H01L 23/48    (2006.01)
H01L 23/52    (2006.01)
H01L 29/40    (2006.01)

(52) U.S. Cl. .................. 257/134; 257/135; 257/136; 257/774; 257/E29.265

(58) Field of Classification Search .................. 257/774, 257/134–136, E29.265
See application file for complete search history.

(56) References Cited

U.S. PATENT DOCUMENTS

| 4,406,049 | A | * | 9/1983 | Tam et al. .................. 438/130 |
| 4,546,366 | A | * | 10/1985 | Buchanan .................... 257/49 |
| 4,939,099 | A | * | 7/1990 | Seacrist et al. .............. 438/189 |
| 4,964,143 | A | * | 10/1990 | Haskell ..................... 257/316 |
| 4,977,108 | A | * | 12/1990 | Haskell ..................... 438/586 |
| 5,028,555 | A | * | 7/1991 | Haskell ..................... 438/217 |
| 5,091,326 | A | * | 2/1992 | Haskell ..................... 438/257 |
| 5,410,175 | A | * | 4/1995 | Kyomasu et al. ............. 257/458 |
| 5,618,688 | A | * | 4/1997 | Reuss et al. ................. 438/189 |
| 5,895,957 | A | * | 4/1999 | Reedy et al. ................. 257/352 |
| 2004/0224464 | A1 | * | 11/2004 | Gonzalez et al. ............ 438/237 |
| 2005/0116289 | A1 | * | 6/2005 | Boyd et al. .................. 257/347 |
| 2005/0230715 | A1 | | 10/2005 | Hoshino et al. ............. 257/263 |

OTHER PUBLICATIONS

*Notification of Transmittal of the International Search Report and the Written Opinion of the International Searching Authority* for International Application No. PCT/US07/70864; 9 pages, Feb. 4, 2008.

* cited by examiner

*Primary Examiner*—Bradley K Smith
*Assistant Examiner*—Alexander Belousov
(74) *Attorney, Agent, or Firm*—Baker Botts L.L.P.

(57) ABSTRACT

A scalable device structure and process for forming a normally off JFET with 45 NM linewidths or less. The contacts to the source, drain and gate areas are formed by forming a layer of oxide of a thickness of less than 1000 angstroms, and, preferably 500 angstroms or less on top of the substrate. A nitride layer is formed on top of the oxide layer and holes are etched for the source, drain and gate contacts. A layer of polysilicon is then deposited so as to fill the holes and the polysilicon is polished back to planarize it flush with the nitride layer. The polysilicon contacts are then implanted with the types of impurities necessary for the channel type of the desired transistor and the impurities are driven into the semiconductor substrate below to form source, drain and gate regions.

5 Claims, 8 Drawing Sheets

FINISHED N-CHANNEL JFET

PRIOR ART METAL CONTACT JFET

PRIOR ART
CROSS-SECTION OF NORMALLY OFF JFET (N-CHANNEL)

DOPING PROFILE OF A JFET THROUGH THE GATE AND CHANNEL

FINISHED N-CHANNEL JFET

FINISHED N-CHANNEL DEVICE
WITH NITRIDE LAYERS

FINISHED P-CHANNEL DEVICE

SCALABLE PROCESS AND STRUCTURE OF JFET FOR SMALL AND DECREASING LINE WIDTHS

BACKGROUND OF THE INVENTION

The invention pertains to a device structure and method for making JFET transistors at very small line widths which can overcome certain process problems caused by the small line widths.

As line widths have shrunk steadily down into the submicron range (today's line widths are 45 nanometers (NM) or 0.045 microns, where a micron is $10^{-6}$ meters and one nanometer equals 10 angstroms), all structures on CMOS, NMOS and PMOS circuits have shrunk including the thickness of the gate oxide. As line widths shrink, the voltages must be dropped to avoid punch through. This shrinking line width means the thickness of gate oxide must also be reduced so that sufficient electric field concentration to cause channel inversions in MOS devices can be achieved at the lower voltages. Shrinking gate oxide thickness causes leakage, which increases power consumption in CMOS circuits and all other MOS circuits. The limit of gate oxide thickness that will not cause leakage is about 50 nanometers, which has already been reached by the current state-of-the-art 45 nanometer line widths.

At one micron line widths, power consumption for a one square centimeter integrated circuit was 5 watts. As line widths shrink to 45 nanometers, power consumption for the same size chip could rise to 1000 watts. This can destroy an integrated circuit which is not cooled properly and is clearly unacceptable for portable devices such as laptops, cell phones etc. This power consumption complicates the design process immensely because it requires additional circuitry to put idle transistors to sleep so they do not leak. This power consumption is only one of the problems caused by shrinking line widths.

Prior art junction field effect transistors date back to the 1950's when they were first reported. Since then, they have been covered in numerous texts such as "Physics of Semiconductor Devices" by Simon Sze and "Physics and Technology of Semiconductor Devices" by Andy Grove. Junction field effect devices were reported in both elemental and compound semiconductors. Numerous circuits with junction field effect transistors have been reported, as follows:

1) Nanver and Goudena, "Design Considerations for Integrated High-Frequency P-Channel JFET's", IEEE Transactions Electron Devices, Vol.; 35, No. 11, 1988, pp. 1924-1933.

2) Ozawa, "Electrical Properties of a Triode Like Silicon Vertical Channel JFET", IEEE Transactions Electron Devices Vol. ED-27, No. 11, 1980, pp. 2115-2123.

3) H. Takanagi and G. Kano, "Complementary JFET Negative-Resistance Devices", IEEE Journal of Solid State Circuits, Vol. SC-10, No. 6, December 1975, pp. 509-515.

4) A. Hamade and J. Albarran, "A JFET/Bipolar Eight-Channel Analog Multiplexer", IEEE Journal of Solid State Circuits, Vol. SC-16, No. 6, December 1978.

5) K. Lehovec and R. Zuleeg, "Analysis of GaAs FET's for Integrated Logic", IEEE Transaction on Electron Devices, Vol. ED-27, No. 6, June 1980.

In addition, a report published by R. Zuleeg titled "Complimentary GaAs Logic" dated 4 Aug. 1985 is cited herein as prior art.

A representative structure of a conventional N-channel JFET is shown in FIG. 1. The JFET is formed in an N-type substrate 10 and is contained in a P-well region 12. The body of the JFET is formed is shown at 14 which is an N-type diffused region containing source 16, channel 18 and drain 20 regions. The gate region 22 is P-type, formed by diffusion into the substrate. Contacts to the source, drain and gate regions are shown at 24, 26 and 28 and connections to these contacts are metal structures shown at 30, 32 and 34. The critical dimension of the JFET is the gate length shown at 38. It is determined by the minimum contact hole dimension marked at 36 plus the necessary overlap required to ensure that the gate region encloses the gate contact. The gate length 38 is significantly larger than the minimum hole dimension. This feature of construction of the prior art JFET limits the performance of these devices since channel length is substantially larger than the minimum feature size. In addition, the capacitances of the vertical sidewalls 40 and 42 of the gate diffusion to source and drain regions, respectively are also quite large. The gate-drain sidewall capacitance forms the Miller capacitance, a term known to those skilled in the art, and significantly limits the performance of the device at high frequencies.

Another problem with the JFET of FIG. 1 is that it is a normally on device. As such, it cannot be used to replace conventional CMOS transistors in today's integrated circuitry with the power leakage problems brought on by shrinking line widths. In order to substitute JFET's for CMOS to solve the power consumption problem at line widths of 45 NM and smaller, it is necessary to have a normally off JFET.

Therefore, a need has arisen for a process to fabricate normally off JFETs and a device structure, both of which eliminate the above noted etching problem and which will scale to smaller linewidths.

SUMMARY OF THE INVENTION

The teachings of this invention include eliminating the etch step whose control is so imprecise as to cause probable damage to the gate region. The novelty of the technique according to the teachings of this invention is to deposit a layer of oxide on the top of the substrate after forming the active islands with the field oxide and implanting the P-well (or N-well in the case of a P-channel JFET). Typically the oxide layer is 500 angstroms thick CVD oxide, but it could also be a "low-K" (low dielectric constant) oxide. Then the oxide layer is masked and etched to form holes where the poly source, drain, gate and substrate contacts are to be formed. The advantage of using low-K oxide over CVD oxide is that the etching of the low-K oxide for the source and drain holes will stop at the thermal oxide of the field oxide regions and not create a notch. This notch will happen if etch overshoot of CVD oxide happens; such a notch is undesirable. The reason this notch is undesirable is because if etch overshoot occurs, the field oxide outside the active area defined by the field oxide is etched down below the surface of the substrate. This causes the gate poly to dip down and form sidewall PN contacts with the gate region which, if deep enough, can short to the gate-substrate junction. Then a layer of nitride is formed on top of the oxide to act as a polish stopper. Nitride is very hard and it stops any polishing process at the nitride layer. After the holes are etched, a layer of polysilicon is deposited so as to fill the holes. The poly is then polished off until the polishing process stops at the nitride layer. Since the oxide layer is only approximately 500 angstroms (50 NM) thick typically (any reasonable depth for this layer can be picked as oxide is well behaved), the poly contacts are only 500 angstroms thick after the polishing process (or as thick as the oxide layer).

After forming the poly contacts, rough masks can be used to dope the poly of the source and drain contacts N+ and to dope the poly gate contact and P-well contact P+ (for an N-channel JFET where the opposite doping is used for a P-channel JFET and opposite substrate and channel and well doping is used also).

After doping the polysilicon, a thermal drive in step is used to drive impurities from the poly into the substrate to form the gate, source and drain regions.

For an N-channel JFET, the gate contact poly and P-well poly contact is doped P+ and the source and drain poly contacts are doped N+. For a P-channel JFET, the gate contact poly and P-well poly contact is doped N+ and the source and drain poly contacts are doped P+.

The tops of the poly contacts can have a layer of silicide formed thereon to reduce the resistance of the poly lines from about 100 ohms per square to less than 2 ohms per square to greatly increase the switching speed and frequency response of the structure. When an inverter is to be made, a normally off N-channel JFET is coupled to a normally off P-channel JFET by extending the poly gate contacts lines so as to couple the gates of the two devices together, connecting the drain of the P-channel JFET to a voltage source, connecting the source of the P-channel JFET to the drain of the N-channel JFET and connecting the source of the N-channel JFET to ground.

DETAILED DESCRIPTION OF THE PREFERRED AND ALTERNATIVE EMBODIMENTS

Figure 1:
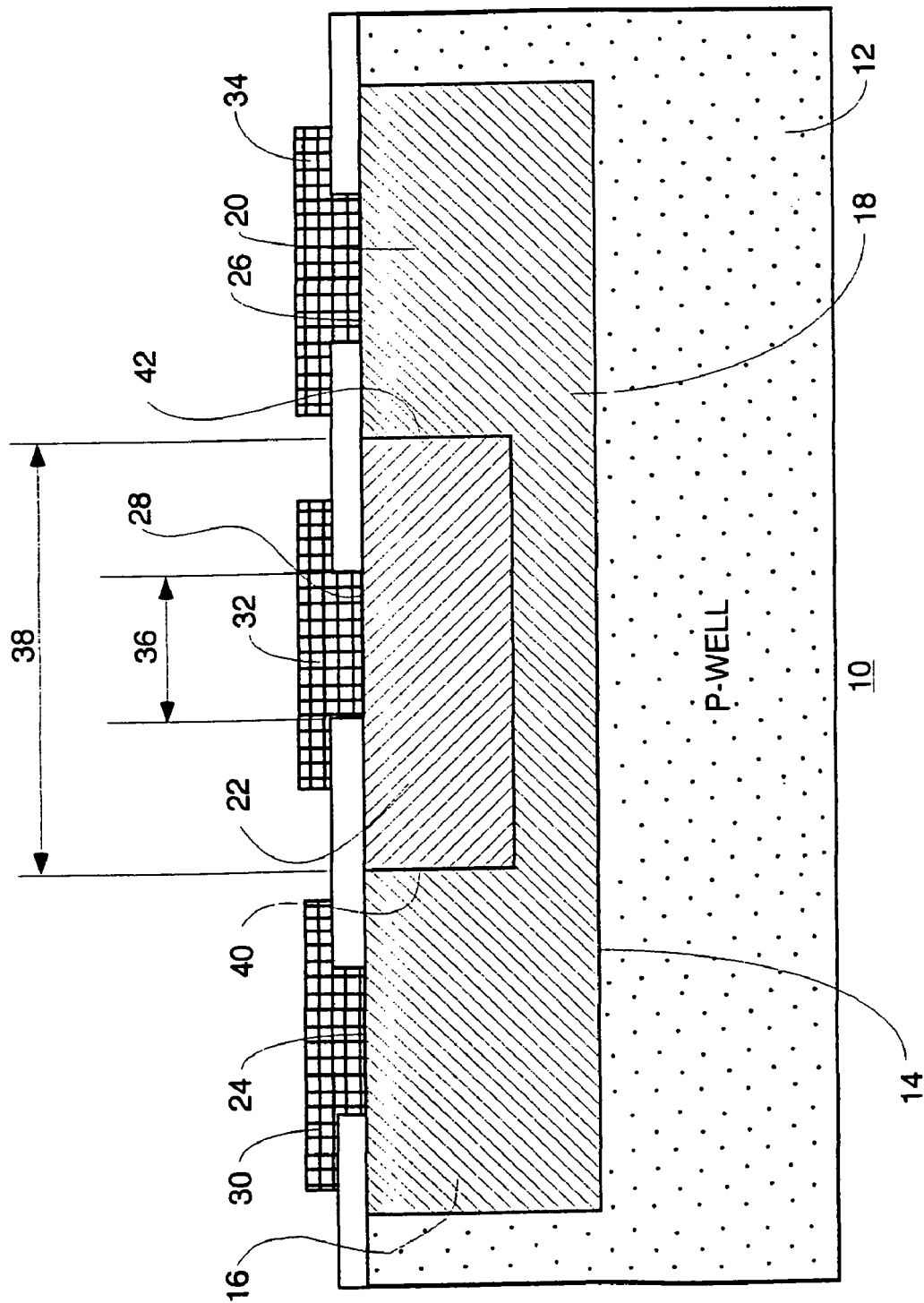
FIG. 1 is a cross-sectional view of a prior art JFET.
Figure 2:
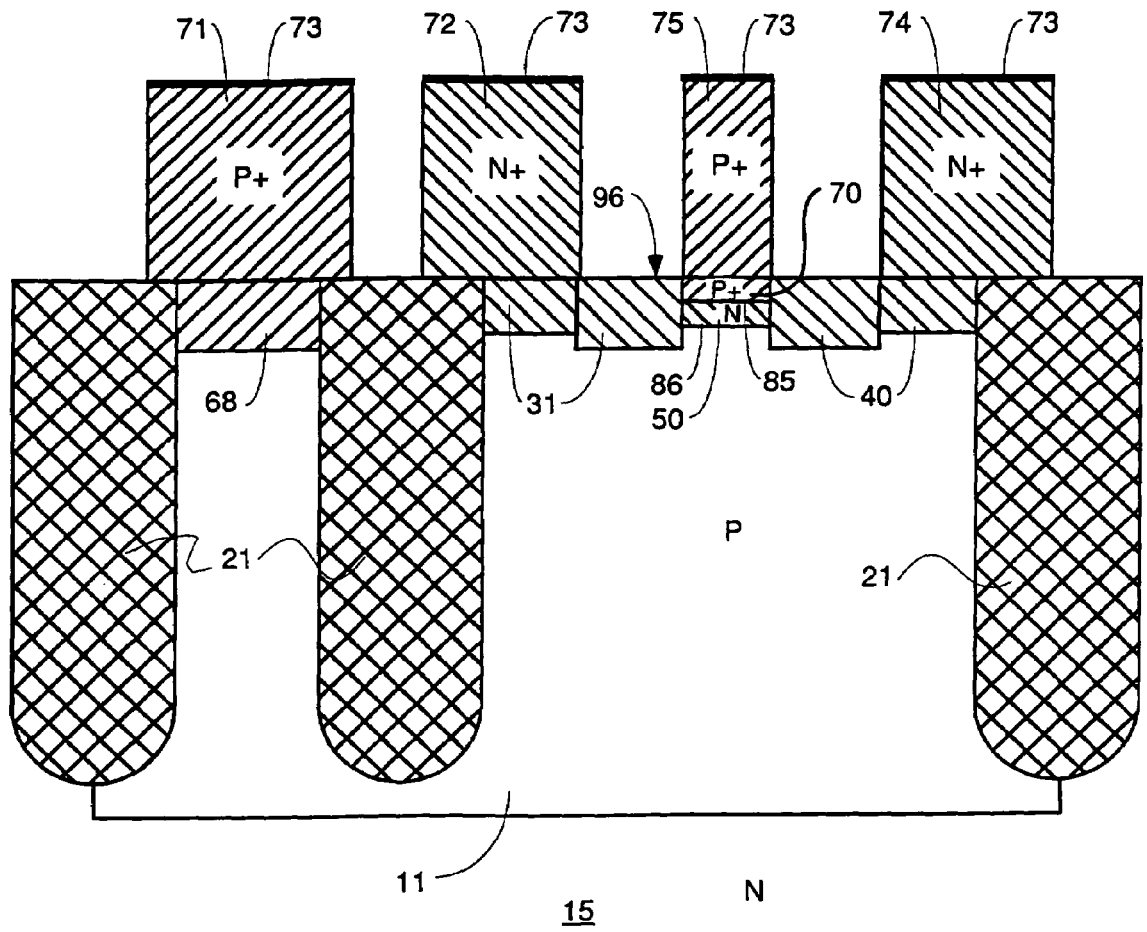
FIG. 2 is a cross-sectional view of one embodiment of a normally off JFET previously invented by co-inventor Ashok Kapoor.

One solution to the increasing power consumption problem of conventional CMOS as line widths shrink is the normally off junction field effect transistor or JFET which was invented by Ashok Kapoor and described in a patent application entitled Complementary Junction Field Effect Transistor Circuit in Silicon and Silicon Alloys, filed Oct. 28, 2005, Ser. No. 11/261,873, which is hereby incorporated by reference. One embodiment of Dr. Kapoor's JFET structure is shown in FIG. 2. This figure is a cross section of a normally-off, N-channel JFET. The JFET has four terminal regions in the substrate and corresponding contacts above the substrate surface. The terminal regions in the substrate are: source 31 (comprised of a diffusion region under Polysilicon contact 72 and an implanted region coupling the diffused region to the channel region 50); gate 70; drain 40 (comprised of a diffusion region under polysilicon contact 74 and an implanted region coupling the diffused region to the channel region 50) and P-well 11, which has an ohmic contact region shown at 68. The contacts to the source, drain, gate and P-well regions are made of polysilicon typically and are: substrate contact 71, source contact 72; gate contact 75 and drain contact 74. The JFET is formed in a region of silicon substrate 15 in FIG. 2. The JFET is isolated from the surrounding semiconductor by insulating regions 21, which are typically shallow trench isolation field oxide. The channel between the source and drain is shown at 50. For an N-channel JFET, the source and drain regions 31 and 40 are N+ regions (highly doped with N-type donor impurities such as phosphorous, arsenic or antimony). The P-well 11 is doped P-type with acceptor impurities such as boron or indium. Contact to the P-well is formed by poly contact 71 which is doped heavily P-type and which, by diffusion during the drive-in process to form the gate, forms an ohmic contact and a P+ region 68 which acts as the P-well contact by virtue of the configuration of the field oxide regions 21 as shown. The field oxide regions must not extend below the depth of the P-well to substrate junction 87 so as to not cut off a conductive path from the ohmic contact 68 to the P-well portion 11 under the channel region 50.

The channel is a narrow region 50 which is doped lightly N-type. The gate is a very shallow (typically 10 nanometers, hereafter NM) P-type region formed in the N-type channel by methods such as diffusion of dopants from the overlying heavily P+ doped polysilicon 75 or ion implantation.

The JFET of FIG. 2 which was disclosed in the patent application incorporated by reference herein is formed in a bulk region of silicon substrate 15. The JFET is isolated from the surrounding semiconductor by insulating regions 21, which are typically shallow trench isolation field oxide, and a back biased PN function formed by layers 11 and 15 (the back gate). The channel between the source and drain is shown at 50. For an N-channel JFET, the source and drain regions 31 and 40 are N+ regions (highly doped with N-type donor impurities). The P-well 11 is doped P-type with acceptor impurities. Contact to the P-well is formed by poly contact 71 which is doped heavily P-type and which, by diffusion during the drive-in process to form the gate, forms an ohmic contact and a P+ region 68 which acts as the P-well contact by virtue of the configuration of the field oxide regions 21 as shown. The field oxide regions must not extend below the depth of the P-well to substrate junction 87 so as to not cut off a conductive path from the ohmic contact 68 to the P-well portion 11 under the channel region 50.

The channel is a narrow region 50 which is doped lightly N-type. The gate is a very shallow (typically 10 nanometers, hereafter NM) P-type region 70 formed in the N-type channel by methods such as diffusion of dopants from the overlying heavily P+ doped polysilicon 75 or ion implantation.

Figure 3:
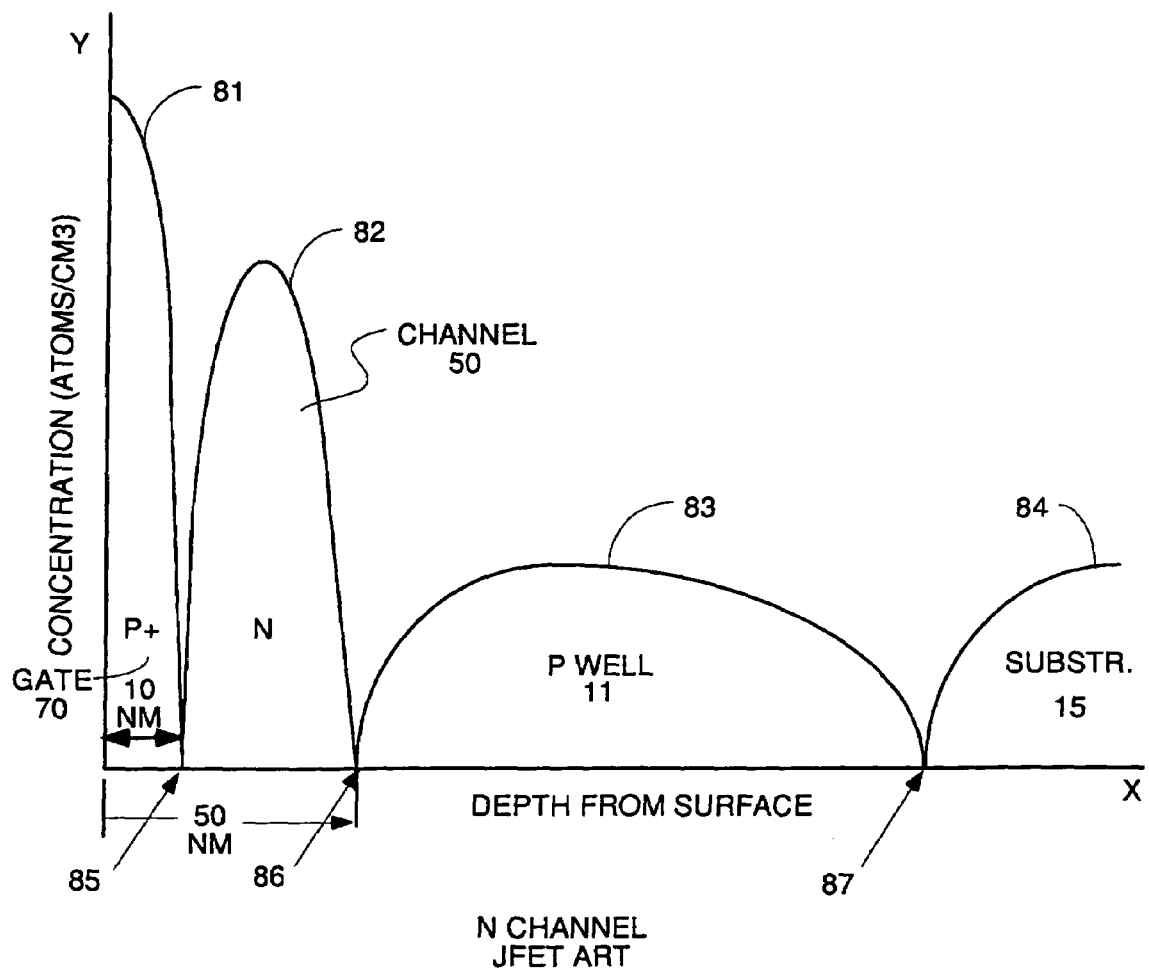
FIG. 3 is a typical doping profile for a JFET like that shown in FIG. 2 and JFET's according to the teachings of the invention (N-channel shown, doping polarities are reversed for P-channel JFET's).

A doping profile of the transistor at varying depths from the surface through the gate 70 and channel 50 is shown in FIG. 3. The drive-in process to form the gate region 70 and the implant to form the channel region 50 are both important because the depth of these regions and their doping must be controlled so that the depletion regions of the gate-channel junction and the channel-P-well junction touch so as to cause pinch off.

Curve 81 is a typical gate doping profile and point 85 is typically only about 10 NM from the substrate surface so the gate is very shallow. This fact is a significant part of the problem that the Kapoor invention solves. Curves 82, 83 and 84 represent the doping profile of the channel 50, the P-well 11 and the substrate bulk regions 15 respectively. The depth of the gate-channel junction is at point 85. The depth of the channel-P-well junction is at point 86 and is typically only 50 NM down from the surface of the substrate. The depth of the well-substrate junction is shown at 87. Each junction has a depletion region on either side of the junction even when the junction has zero bias across it.

As alluded to earlier, the normally off JFET device allows JFET inverters to replace MOS inverters at small line widths to get around the leakage problem. The key to this device is to design the device such that the depletion region surrounding the gate-channel junction 85 is large enough to extend down to the boundary of the depletion region surrounding the channel-well junction 86 (or channel-substrate junction 86 in the case of embodiments of FIGS. 6 and 15). This pinches off current flow thereby making a normally off device. The depletion regions around each junction have a fixed width at zero bias and the junction lies somewhere in the interior of the depletion region. How far above and below a PN junction the depletion region goes depends upon the relative doping concentration of the semiconductor above and below the junction. The doping concentration of the regions above and below junctions 85 and 86 and the size of the gate and channel regions are coordinated so that pinch off occurs. To aid in this process, an implant of P-type impurities is made in some embodiments just below the channel junction 86 to force the depletion region around junction 86 upward to meet the downward extent of the depletion region around gate junction 85; this ensures that the required pinchoff occurs. This P-type implant is not shown in the figures illustrating the process of the invention but is used if necessary to ensure pinchoff.

Figure 4:
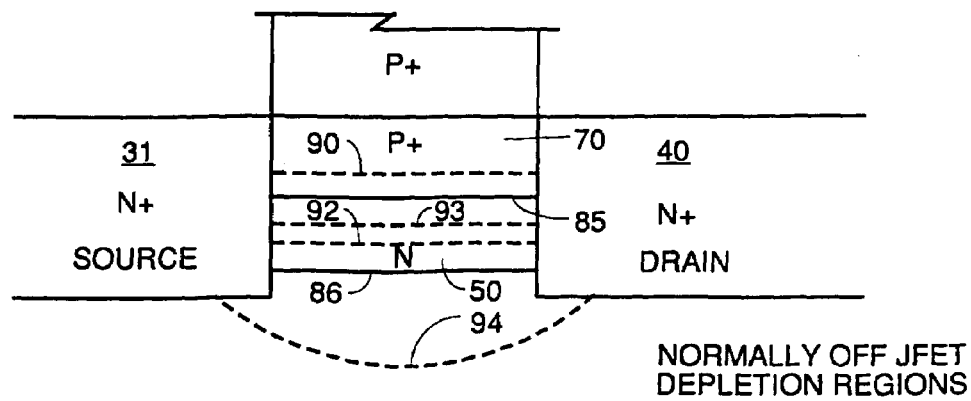
FIG. 4 is a close up view of the channel and gate regions of the JFET according to FIG. 2 and JFET's according to the invention showing how the depletion regions are extended to cause pinch off.

FIG. 4 is a blown up view of the gate and channel regions showing the boundaries 90 and 93 of the depletion region around the gate-channel junction 85. The lower boundary of the depletion region around the channel-P-well function is 94 and its upper boundary is dashed line 92. The lower boundary 93 of the gate-channel junction 85 in the channel region 50 is not shown as coincident with the upper boundary 92 of the depletion region around the channel P-well junction 86 for clarity, but in the normally off JFETs invented by Ashok Kapoor, the doping and junction depths are controlled so that boundary 92 is coincident with boundary 93 so that pinchoff occurs at zero gate bias. This causes pinch off so no current flows from source 31 to drain 40 through channel 50 until bias is applied across the gate-channel junction to change the depletion region situation.

The depth of the gate-channel junction 85 has to be small because the width of the depletion layer, i.e., the distance between boundaries 90 and 92 is fixed. To achieve pinchoff, most of this depletion layer needs to be in the channel region 50 so as to meet the depletion layer surrounding the channel-well junction 86. To make this happen, the concentration of impurities in the gate region 70 must be kept much higher than the concentration of impurities in the channel region. This is done by keeping the gate region very thin thereby keeping the impurity concentration very high. If the thickness of the gate layer 70 increases, the concentration of impurities drops, the depletion region moves further into the gate layer and does not penetrate the channel region as much and the pinchoff does not occur so the device becomes a normally on device again. Mr. Kapoor's design allows 1 square centimeter chips to be made using 45 NM line widths and which consume far less power than is consumed by 45 NM MOS. But the required thinness of the gate region creates a Problem in the construction of the device.

The problem with forming the structure of FIG. 2 has to do with etching the poly contacts 71, 72, 75 and 74. This etch must stop at the surface 96 of the substrate. If it overshoots and etches into the substrate, the device is likely to be destroyed since the gate region 70 is only 10 NM thick and even a small overshoot will damage or wipe out the gate region or etch into the source and drain regions Past the depth of the gate region. The poly etch is a plasma etch, and the etching machine can be asked to stop when it senses the oxygen atoms that are released when the field oxide is reached; however this control is not Precise enough since the gate layer is only 10 NM thick, and by the time the machine senses the oxygen atoms, it is too late. When the line width decreases to 25 NM, this problem gets worse because the gate layer thickness will be even smaller at 25 NM linewidth.

Etching overshoot is very likely because the Poly layer deposited on the surface of the substrate from which poly contacts 71, 72, 75 and 74 will be formed is about 1500 angstroms thick and it is difficult to Precisely control the depth of etching of such a Poly layer because the error in etch depth is a percentage of the thickness of the layer. Therefore, a 1500 angstrom thick poly layer which has an etch stop error of 10% may go 150 angstroms too far past the surface of the substrate and etch right by the gate region and destroy the transistor. It is therefore desirable to reduce the thickness of the poly layer to reduce the etch stop error, but this is not possible because in creating thin poly layers of 1000 angstroms or less, there is very little control for reasons which are not well understood. Thus an attempt to make a 1000 or 500 angstrom thick Poly layer will result in erratic layer thicknesses and eratic etch thickness control.

It is undesirable to increase the thickness of the gate region 70 because to make this region thicker increases the parasitic junction capacitance of the side junctions between the gate and source and drain regions. This parasitic junction capacitance slows the switching speed of the device down unnecessarily.

Much more precise control is required to form the source, gate and drain poly contacts above the substrate surface for reliable device fabrication.

Figure 5A:
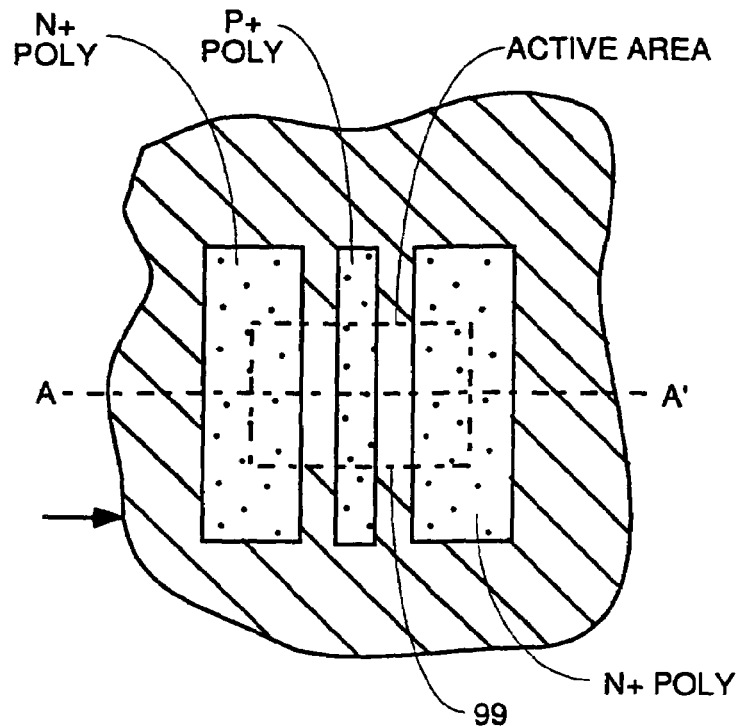
FIG. 5A is a layout view of the finished JFET according to the teachings of this invention (less metal lines to make connections to the poly contacts.
Figure 5B:
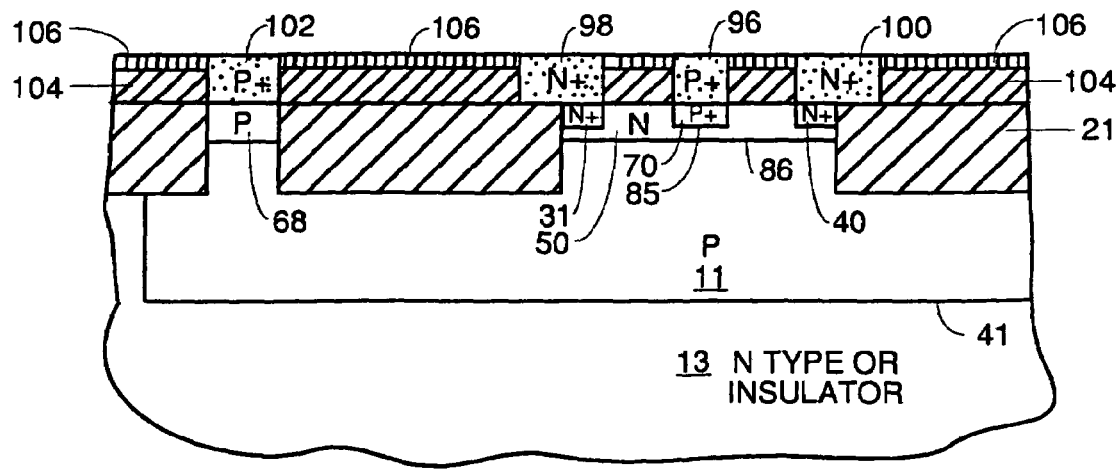
FIG. 5B is a cross-sectional view of the finished N-channel JFET according to the teachings of one embodiment of the invention along section line A-A' in FIG. 5A for an embodiment built within a shallow P-well.
Figure 6:
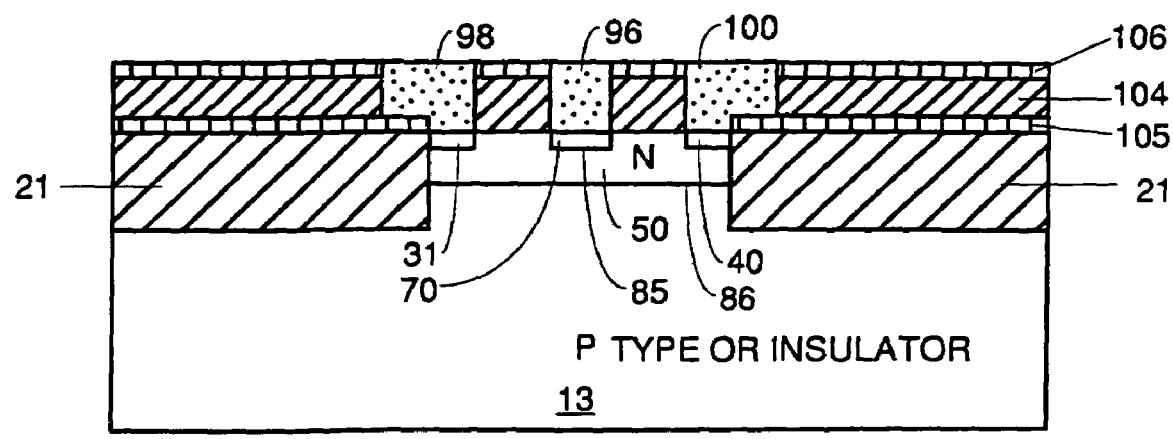
FIG. 6 is a cross-sectional view of a finished stand alone N-channel device built according to the teachings of one embodiment of the invention for building the above the substrate surface contact structure, and showing the use of nitride layers both on top of oxide layer 104 as a polish stop as well as on top of field oxide layer 21 as an etch stop.

FIG. 5A is a layout view of an embodiment of a finished JFET according to the teachings of the invention (less metal lines to make connections to the poly contacts. FIG. 5B is a cross-sectional view of the finished N-channel JFET according to one embodiment of the invention along section line A-A' in FIG. 5A for an embodiment built within a shallow P-well. This is the construction most often used as it is the construction used to make inverters comprised of a normally off N-channel JFET and a normally off P-channel JFET. The normally off P-channel JFET used for a JFET inverter has the same construction but the polarities of doping of the source contact 31, drain contact 40, gate contact 70 and back gate contact 68 are reversed, and the P-well 11 is an N-well (doped N-type) for the P-channel JFET. Unlike the normally off JFET shown in FIG. 2 invented by Ashok Kapoor, the bulk substrate 13 in the embodiment of FIG. 5B is doped N-type in this embodiment. In an alternative embodiment, the substrate may be made of an insulating material with the semiconductor from which the active area will be formed grown thereon epitaxially. Such wafers are commercially available. In such an embodiment, region 13 is insulator so there is no P-well-substrate PN junction 41. This results in less parasitic capacitance which slows the device down by virtue of elimination of the PN junction 41. The same structure can be used for the embodiment of FIG. 6 where region 13 can be P-type or an insulator. All the drawings illustrating the process of construction indicate the substrate 13 as P-type, but persons skilled in the art should recognize that region 13 can be an insulator FIG. 6 is a cross-sectional view of a finished stand alone N-channel device built according to the teachings of one embodiment of the invention for building the above the substrate surface contact structure, and showing the use of nitride layers both on top of oxide layer 104 as a polish stop as well as on top of field oxide layer 21 as an etch stop. FIG. 6 is a cross-sectional view along section line A-A' in FIG. 5A of a finished normally-off, stand-alone N-channel JFET which is not built in a P-well. This N-channel JFET is not built in a P-well because it does not need to be electrically isolated from an adjacent normally-off P-channel JFET built in an N-well as part of a JFET inverter. In the embodiment of FIG. 6, the P-doped silicon area 13 is actually the bulk substrate unless an inverter requiring both an N-channel and a P-channel device is to be formed. If an inverter is to be formed, the region 13 is a P-well for an N-channel device and an N-well for an P-channel device. The process flow described below is illustrated in terms of drawings at various stages in the construction of the structure of FIG. 6 to build an N-channel device alone, and region 13 is P-doped substrate. If a P-channel device is to be built, then all the polarities of doping are reversed and region 13 is N-doped substrate. If an inverter is to be built, then each P-channel and N-channel device needs to be built in its own well (P-well for N-channel device and N well for P-channel device) so that the two devices may be isolated. To make the isolated P-well structure shown in FIG. 5B, it is only necessary to modify the process flow described below to make a P-well implant 11 (or N-well implant) before the field oxide regions 21 are formed.

In the non P-well embodiment of FIG. 6, thermal or STI (Shallow Trench Isolation) field oxide layers 21 define an active region in which the gate region 70 and channel region 50 are formed.

In the P-well embodiment of FIG. 5B, the field oxide (referred to in the claims as a nonconductive region formed in the substrate) defines a first conductive region in the substrate which is electrically isolated from neighboring structures in the substrate (except for the substrate contact area) and in which the channel 50 and gate 70 regions are formed and a second conductive region which is electrically isolated from neighboring structures in the substrate except for the P-well where the channel 50 is formed. The nonconductive region is formed so as to allow conduction between the P-well portions of the first and second conductive regions, but to isolate this overall active region from surrounding structures integrated into the substrate. This second conductive region is the region where substrate contact region 68 is formed in FIG. 5B.

The gate region 70 in the preferred embodiments is thermally driven in using the impurities of the overlying poly gate contact 96 in the preferred embodiment. The gate region 70 is doped P+ and the time interval of the drive-in interval is kept short so that the depth of the gate-channel junction 85 is only about 10 NM from the substrate surface.

The channel region 50, in the preferred embodiments, is formed by implantation typically, and the channel-P-well junction 86 is typically only about 50 NM from the surface of the substrate. The doping of the channel and gate regions and their depths are set so that pinchoff (at zero bias across the gate-channel and channel-P-well junction) occurs by the depletion region portion below the gate-channel junction 85 extending to meet the portion of the depletion region above the channel-P-well junction 86. Poly contacts 98 and 100 are doped N+ and the impurities therein are driven into the substrate to form the source region 31 and drain region 40, both of which are doped N+. The drive-in to form the source and drain regions occurs at the same time in the same oven bake as the drive in to form the gate region 70.

In embodiments like FIG. 5B where P-wells or N-wells are used for isolation, a poly P-well (or N-well in the case of a P-channel device) contact 102 is doped P+ and its impurities are driven into the substrate to form P+ohmic contact 68 to the P-well 11 at the same time as the gate region drive in.

What is different about the embodiments of FIG. 5B and FIG. 6 over the embodiments of FIG. 2 is the thickness and smoothness of the top surfaces of the poly contacts 102, 98, 96 and 100, and the absence of the implanted extensions of the source and drain regions. These poly contacts are formed by first depositing a layer of silicon dioxide 104 (hereafter oxide) on the surface of the substrate. In the preferred embodiment, this layer is about 500 angstroms thick, but other thicknesses can be chosen which are either thicker or thinner. As line widths decrease, the thickness of oxide layer 104 can be decreased so that the narrow holes needed for the poly contacts can be formed without optical problems that occur when a deep narrow hole is to be formed. Low dielectric constant oxide is highly preferred when line widths decrease below 45 NM.

After the oxide layer is formed, a layer of nitride is formed on top of the oxide, and then a mask is used to define photoresist which defines the locations of holes to be etched in the oxide layer 104 at the locations of the poly contacts 102, 98, 96 and 100. These holes are then etched. In alternative embodiments like that shown in FIGS. 6 and 15, a layer of nitride 105 is formed over the field oxide 21 before the layer of oxide 104 is formed. This layer of nitride 105 acts as an etch stop even if the oxide layer 104 is not low K oxide. This etch stop nitride 105 stops the etch of oxide layer 104 at the nitride layer 105 so as to protect the field oxide from notching at the location of the holes in the oxide where the poly contacts will be even when CVD oxide is used. The layer of nitride 106 in FIG. 15 acts as a polish stop when polishing off the excess poly so that the poly contacts will have planar tops flush with the top of the nitride layer 107. These same two nitride layers 105 and 107 can be incorporated into the process for construction and device structure of the embodiment of FIG. 5B and are shown in the embodiment of FIG. 6 for an N-channel device and the embodiment of FIG. 15 for a P-channel device formed on an insulating substrate.

After forming the nitride layer and the holes, undoped poly is deposited so as to fill the holes and cover the oxide and nitride layers. The poly is then polished off down to the top of the nitride layer so that the poly is flush with the top of the nitride layer. Thus, the top of the poly contacts will be relatively smooth and flush with the top of the nitride layer.

Next, rough non-precision masks are used to mask off the poly contacts so that the gate poly contact 96 and the P-well poly contact 102 can be doped P+ (or vice versa if a P-channel device is being built) and the source and drain poly contacts 98 and 100 can be doped N+ (or vice versa if a P-channel device is being built).

After doping the poly layers, a drive in step is performed to bake the structure at a sufficiently high temperature to drive the dopant impurities in the poly into the substrate regions right below the poly. The time and temperature of this bake is set so as to form a shallow gate region which is sufficiently shallow (typically 10 NM) so as to remain sufficiently high in dopant concentration to cause most of the depletion region surrounding the gate-channel junction 85 to be in the N-channel region. The depth of the channel region and doping thereof is controlled so that the upper reaches of the depletion region above the channel-P-well junction 86 touches the depletion region extending down from the gate-channel junction 85 thereby causing the desired pinch off effect.

The Process of Construction of an N-Channel JFET

Figure 7:
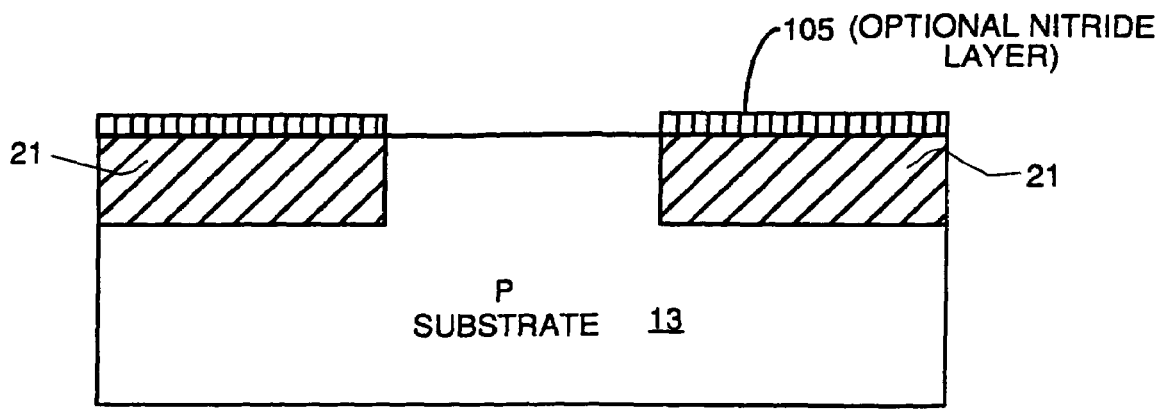
FIG. 7 illustrates the state of construction after the P-well 11 and the field oxide region 21 has been formed to isolate the JFET from surrounding structures.

FIG. 7 illustrates the state of construction after the field oxide region 21 has been formed to define the active area in a 100 P-type semiconductor wafer. The resistivity of the bulk semiconductor substrate 13 is preferably 10 ohm-CM. The insulating region 21 is preferably 2000-angstrom STI (Shallow Trench Isolation). An optional nitride layer 105 is shown as formed on top of the field oxide layer to act as an etch stop to prevent the over-etching step mentioned above from possibly causing shorting which would render the device inoperative. In the rest of FIGS. 8 through 14, this layer of nitride 105 is not shown, but in an alternative embodiment, it is present.

In embodiments where inverters are to be formed so that P-wells are necessary for the N-channel devices and N-wells are necessary for the P-channel devices, the P-well and N-well implants are performed first before forming the field oxide regions 21. These P-wells and N-wells isolate the JFETs constructed therein from surrounding structures. Typical implant energy is 50 KEV with a dose of 5E11. A P-well drive-in at 950 degrees C., N2 60' is then performed.

The reader will note that details not pertinent to the novel part of the process and structure have been omitted from FIG. 7 and the remaining Figures describing the process. The process illustrated is to build stand alone JFET's with no P-well or N-well. If an inverter is to be built, the P-well and N-well is necessary to isolate the N-channel device in the P-well from the P-channel device in the N-well and back gate surface contacts to each of the P-well and the N-well are necessary to be able to apply bias to the back gate. Details illustrating the relationship of the P-well or N-well and the substrate 13 and the P-well or N-well contact 68 and the electrical connection between the first and second conductive regions which are shown in FIGS. 2 and 5B have been omitted from FIG. 7 and following because those details are not the novelty of the invention. However, those details can be found in U.S. patent application Complementary Junction Field Effect Transistor Circuit in Silicon and Silicon Alloys, filed Oct. 28, 2005, Ser. No. 11/261,873 which is incorporated by reference.

Figure 8:
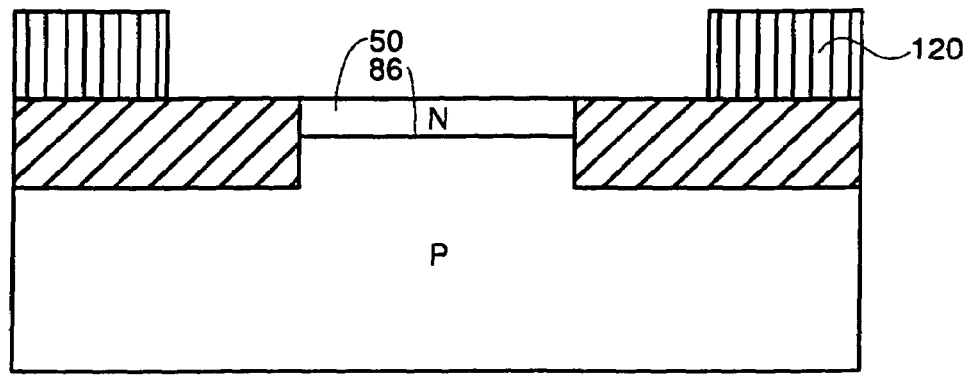
FIG. 8 is a cross-section of the structure after the N-channel implant 50 is formed using a mask and developing photoresist pattern 120 to shield surrounding areas of the substrate from implantation.

FIG. 8 is a cross-section of the structure after the N-channel implant 50 is formed using a mask and developing photoresist pattern 120 to shield surrounding areas of the substrate from implantation. Before forming the implant mask, a layer of thermal oxide which is approximately 50 angstroms thick is formed on the surface of the substrate and a layer of nitride which is approximately 100 angstroms thick is formed on top of the oxide. This layer is not shown in the drawings and should be considered part of the process of doing the implant of the channel region. The subsequent oxide layer 104 and nitride layer 106 to be described below is formed on top of this initial oxide and nitride layer.

The N-channel implant is done so as to achieve a concentration of approximately $10^{18}$ dopant atoms per cubic centimeter. Implant energy is set to establish the channel-substrate junction 86 at about 50 NM. Other depths and doping concentrations can be selected so long as they are coordinated with the depth and doping concentration of a gate regions to be formed later so as to achieve pinchoff and normally off operation. A typical channel implant is 1E13 dosage at 15 KEV followed by another implant of 4E11 dosage at 37 KEV to achieve optimum doping profile for a normally off N-channel JFET.

Figure 9:
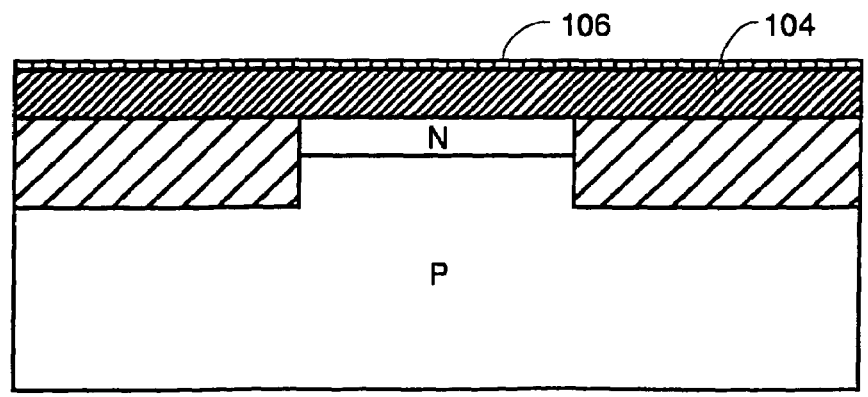
FIG. 9 is a cross-section of the structure after removal of the photoresist 120 and deposition of a layer of oxide 104.

FIG. 9 is a cross-section of the structure after removal of the photoresist 120 and formation of a layer of insulating material 104, which is preferably approximately 500 to 1000 angstroms of CVD silicon dioxide 104 (hereafter oxide). The insulating layer 104 is formed over the previously described pre-implant oxide and nitride layer. A second nitride layer 106, which is approximately 50 angstroms thick, is formed on top of the oxide layer 104 after it is formed.

In some embodiments, other insulating layers 104 that can be etched to form holes for the polysilicon could be used. Examples are nitride and a whole host of other insulating materials. However, it is necessary that thin layers such as 500 angstroms can be formed and that the insulating layer can be etched to form holes for the contacts, and it is important that the material selected does not interfere with the doping of the active area beneath the layer during its formation or during subsequent processing. The other types of insulating materials have inferior dielectric constant properties and/or inferior etching properties compared to oxide so oxide is preferred. The oxide layer 104 is preferably formed with low dielectric constant oxide (low K oxide), but Chemical Vapor Deposition (CVD) oxide can also be used so as to avoid high temperatures of thermal oxidation which could drive the channel region in further and change the junction depth. Low K oxide for layer 104 in FIGS. 5B and 6 is highly preferred at line widths below 45 NM so as to prevent the parasitic capacitance between the gate contact 96 and its neighboring source and drain contacts 98 and 100 from rising to unacceptable levels and slowing down the device when these contacts are formed close together. Low-K oxide is also preferred for another reason. If CVD oxide is used, when the source and drain contact holes are etched, the etching process does not stop immediately upon reaching the field oxide layer 21. This leaves a small notch in the field oxide which is undesirable. When low-K oxide is used, this etching over shoot notch does not occur.

In an alternative embodiment, a layer of nitride 106 is formed on the top surface of the field oxide layers 21 in FIG. 5A (the layer of nitride 106 is not shown in FIG. 5A, but is shown as an optional layer in FIG. 7) after the field oxide is formed. This nitride does not form over the silicon of the active area. Then the layer of oxide 104 is formed using CVD deposition and when the holes for the poly contacts are etched, no etch overshoot occurs because the nitride over the field oxide layer stops the etch at the nitride layer and prevents notching of the field oxide. The reason this notching is undesirable can be best understood by reference to FIGS. 5A and 5B. If etch overshoot occurs in embodiments where optional nitride layer 106 is not formed over the field oxide, then the field oxide outside the active area 99 defined by the field oxide is etched down below the surface of the substrate. This causes the gate poly 96 to dip down and form sidewall PN contacts with the channel region (50 in FIG. 5B) after the dopants in the poly 96 are driven into the substrate to form the gate region 70. If these sidewall PN junctions are deep enough (the notch is deep enough), they can short to the gate-substrate junction 86 and render the device inoperative.

The oxide layer 104 is about 500 angstroms thick in the preferred embodiment, but it can be thicker and it can be thinner in other embodiments. The rationale of choosing 500 angstroms (or any thickness less than 1000 angstroms) is to show that poly contacts of less than 1000 angstroms can indeed be built which was thought to be impossible or at least very difficult in the prior art with any degree of reliability. The difficulty in the prior art arose because of the problem of only being able to control the depth of a poly etch to within plus or minus 10% of the poly layer thickness. The invention claimed removes this difficulty by removing the poly etch step altogether and replacing it with the steps: forming an oxide layer with a nitride layer on top; etching holes for the poly contact; poly fill; and polish back to remove poly to the top of the nitride steps. The only reason the thickness of the poly matters is because of the line width. The line width controls how wide the poly contact windows are. The idea in shrinking geometries is to shrink everything so more devices can be put on the same size die. Larger dies have more faults, so yield goes down, so shrinking the line size has been the game. When 45 NM line widths can be achieved, there is a disadvantage to making the holes for the poly contacts larger than 45 NM as that requires the transistor channel region to be bigger and wastes space. Therefore, since the widths of the poly contact holes is 45 NM, the thickness of the oxide layer and the poly layer needs to be some thickness that is compatible with 45 NM hole width. Narrow holes in thick layers do not have good characteristics when using photoresist technology so 500 NM oxide layer thickness is a good choice for this linewidth but other thinner or thicker layers can be chosen given the above considerations.

The layer of nitride 106 is formed on top of the insulating layer 104 to act as a polish stop so that the step of polishing off excess polysilicon of a layer to be described below does not also remove the oxide.

Figure 10:
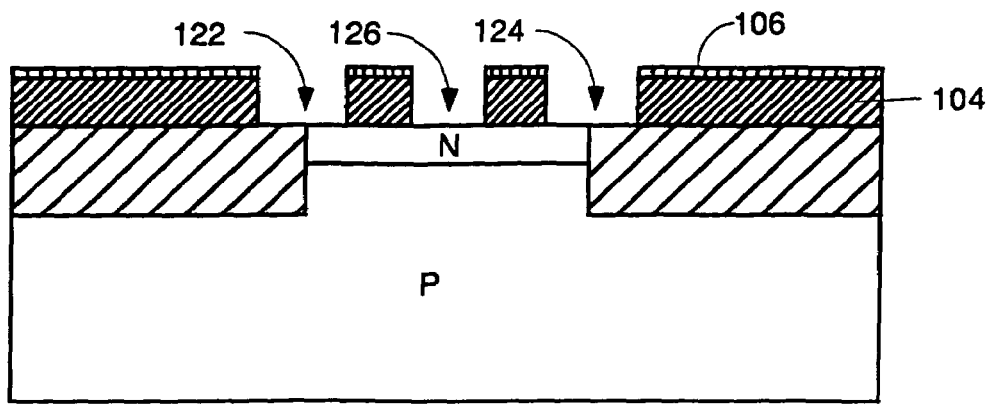
FIG. 10 is a cross-section through the structure after masking and etching to form the holes in the oxide layer in which the poly contacts will be formed.

FIG. 10 is a cross-section through the structure after masking and etching to form the holes in the oxide layer in which the poly contacts will be formed. The holes at 122 and 124 are where the source and drain poly contacts 98 and 100 will be formed. The hole at 126 is where the gate poly contact 126 will be formed. The hole for the substrate contact is not shown for embodiments like FIG. 5B. In embodiments where low K oxide is used, the etching stops automatically at the field oxide 21 and does not form a notch. In embodiments where nitride is formed on top of said field oxide before the oxide layer 104 is formed, CVD oxide can be used for layer 104 and there will be no etching overshoot problem that notches the field oxide since the nitride will stop the etch at the top of the field oxide.

Figure 11:
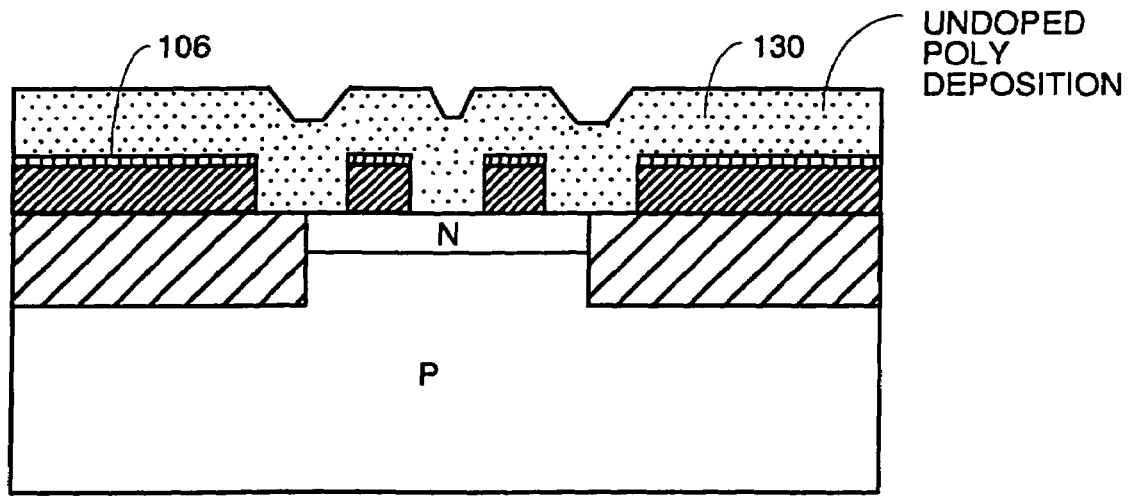
FIG. 11 is a cross-section through the structure after the deposition of undoped polysilicon layer 130.

FIG. 11 is a cross-section through the structure after the deposition of undoped polysilicon layer 130. This layer has to be thick enough to completely fill the holes in the oxide layer, and is typically 1500 angstroms thick. In some embodiments, the polysilicon layer could possibly be doped to P-type or N-type upon deposition and then selectively re-doped as needed to form whatever contacts have the opposite doping type from the initial doping.

Figure 12:
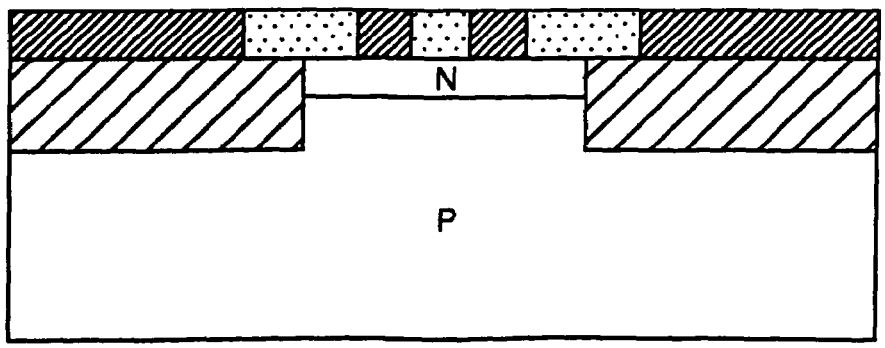
FIG. 12 is a cross-sectional view of the structure after performing a CMP polishing step to remove the excess poly and planarize it so as to be level with the top of said nitride layer 106.

FIG. 12 is a cross-sectional view of the structure after performing a CMP polishing step to remove the excess poly and planarize it so as to be level with the top of said nitride layer 106.

Figure 13:
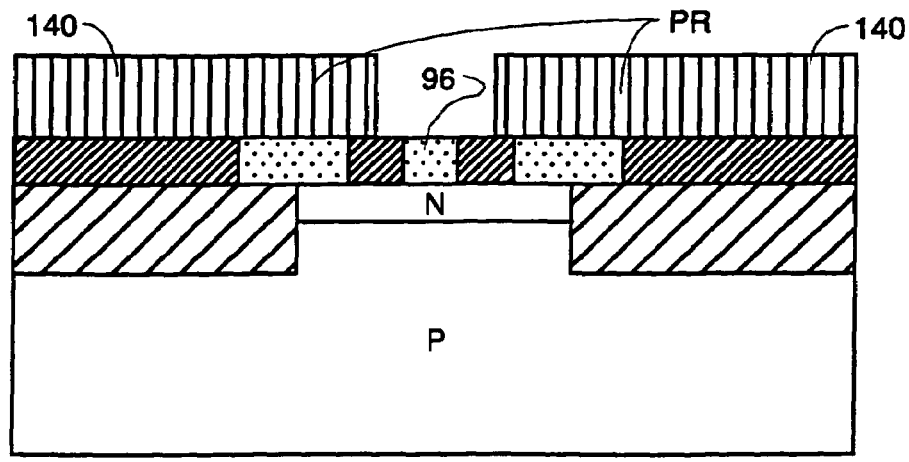
FIG. 13 is a cross-sectional view of the structure after masking for the gate contact doping.

FIG. 13 is a cross-sectional view of the structure after masking for the gate contact doping. Photoresist 140 shields everything but the gate poly contact 96 from a P+ doping implant (for an N-channel device—N+ doping for P-channel device). This P+ implant is typically BF2 2E15 at 15 KEV and 2E15 at 36 KEV.

Figure 14:
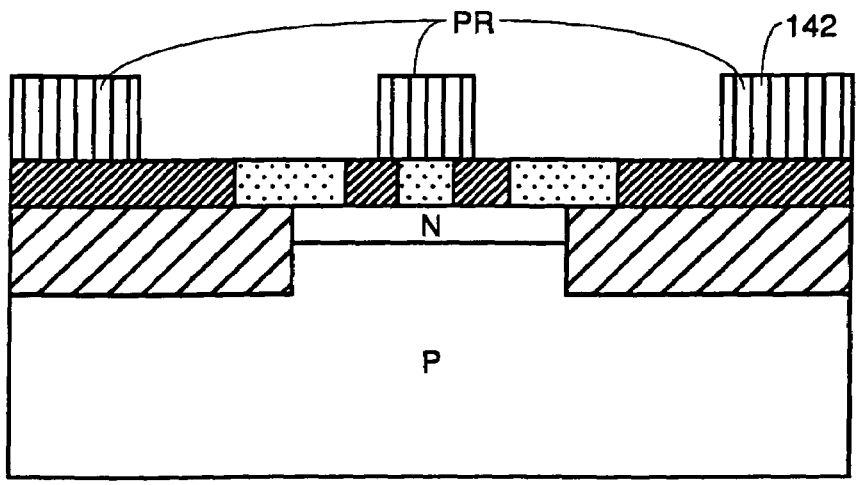
FIG. 14 is a cross-sectional view of the structure after masking for the source and drain contact doping.

FIG. 14 is a cross-sectional view of the structure after masking for the source and drain contact doping. Photoresist 142 shields the gate poly contact 96 and field oxide regions from a N+ doping implant (for an N-channel device—P+ doping for P-channel device). This N+ implant is typically arsenic at !E15 at 25 KEV.

The final steps to form an operative normally off JFET are carried out by stripping the photoresist and annealing the structure at approximately 900 degrees C. for five seconds to drive in the source, gate and drain diffusions simultaneously. A 100 angstrom layer of titanium is then deposited, annealed and etched to form silicide connection lines to form whatever circuit is being built.

The above described process is capable of making a 45 NM or smaller normally-off JFET with no leakage. In order to achieve smaller size devices, scaling of the oxide layer and poly layer thickness downward below 500 angstroms will occur to thicknesses compatible with the smaller line width such as 25 NM.

Figure 15:
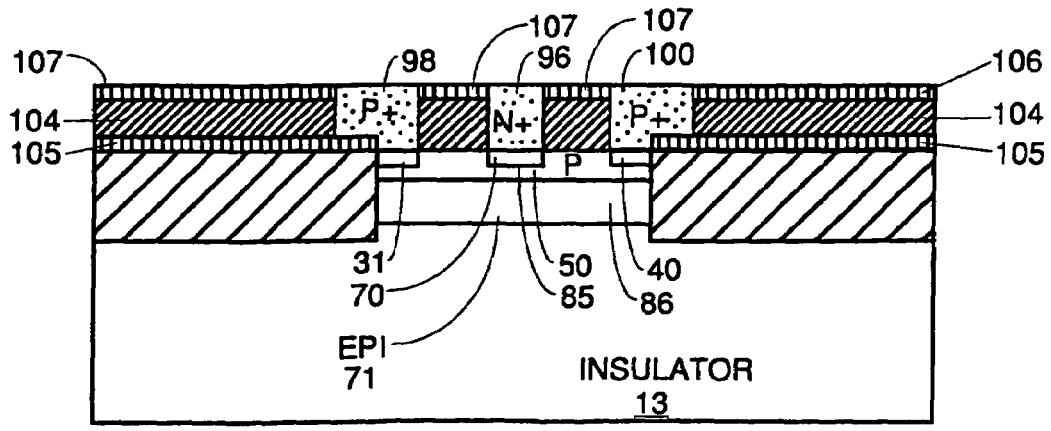
FIG. 15 is a cross-sectional view of a normally off P-channel JFET having nitride formed on top surface of the deposited oxide layer 104 to act as a polishing stop and on top of the field oxide so as to act as an etch stop.

FIG. 15 is a cross-sectional view of a normally off P-channel JFET formed on an insulating substrate 13. The device of FIG. 15 is built on an insulating substrate 13 by forming an epitaxially grown layer of semiconductor 71 (hereafter epi layer) on top of the insulating substrate. The Shallow Trench Isolation process is then used to define an active area for each device in the epi layer 71. A channel implant into the epi layer 71 and anneal step forms the channel region in the active area. Source, drain and gate contacts are formed by diffusion of impurities from the overlying poly contacts into the active area semiconductor below each contact. Source, drain and gate contacts (and back gate contacts where necessary) are formed as described previously. This embodiment has nitride 106 formed on top surface of the deposited oxide layer 104 to act as a polishing stop and utilizes a nitride layer 105 on top of the field oxide so as to act as an etch stop to prevent the overetching step described earlier herein which can short the channel-P-well junction. The doping for a P-channel device with source and drain contact polysilicon contacts 98 and 100 doped P+ and the gate contact 96 doped N+. A layer of suicide is formed on top of each poly contact in one embodiment to reduce resistivity of the poly contacts. In another alternative embodiment, a layer of silicide is formed at the intersection of each of the source, drain and gate contacts with the active area to form ohmic contacts to said source, drain and gate regions, respectively and this can be done in conjunction with silicide on top of the poly contacts or not.

Although the invention has been disclosed in terms of the preferred and alternative embodiments disclosed herein, those skilled in the art will appreciate that modifications and improvements may be made without departing from the scope of the invention. All such modifications are intended to be included within the scope of the claims appended hereto.

What is claimed is:

1. A contact substructure for an integrated normally off channel JFET comprising:

a layer of silicon dioxide or other insulator (hereafter oxide layer) formed on an upper surface of a substrate in which the normally off JFET is formed in an active area of semiconductor defined by an area of insulating material in said substrate, said oxide layer having:
a first hole formed above and at least partially aligned with a source region of the JFET and filled with polysilicon to form a source contact;
a second hole formed above and at least partially aligned with a drain region of the JFET and filled with polysilicon to form a drain contact; and
a third hole formed above and at least partially aligned with a gate region of the JFET and filled with polysilicon to form a gate contact; and
a nitride layer formed at least on top of said oxide layer;
wherein:
the polysilicon filling said holes in said oxide layer has a surface that is coplanar with a surface of the nitride layer;
the polysilicon forming said gate contact is doped to a first conductivity type;
the polysilicon forming the source contact is doped to a second conductivity type; and
the polysilicon forming the drain contact is doped to the second conductivity type.

2. The apparatus of claim 1 wherein said insulating material in said substrate defining said active area is Shallow Trench Isolation silicon dioxide, and further comprising a layer of nitride formed on said upper surface of said substrate under said layer of oxide and over said Shallow Trench Isolation silicon dioxide to act as an etch stop to prevent etching of said Shallow Trench Isolation silicon dioxide at the locations of said holes for said source and drain contacts.

3. An integrated normally off JFET comprising:
a substrate having at least a portion thereof made of semiconductor and having a top surface;
a well region formed in said semiconductor portion of said substrate and doped to a first conductivity type;
an insulating material formed in said semiconductor portion of said substrate so as to form an active region in said semiconductor portion of said substrate, said active region comprised of a first conductive region in said well in which the normally off JFET is formed and a second conductive region electrically coupled to said first conductive region to which a back gate or well contact is formed;
a conductive channel region formed in said first conductive region and doped to a second conductivity type;
a conductive gate region formed in said first conductive region and doped to said first conductivity type;
a conductive source region formed in said first conductive region and doped to said second conductivity type;
a conductive drain region formed in said first conductive region and doped to said second conductivity type;
a conductive well contact region formed so as to make electrical contact with said second conductive region;
a layer of insulating material formed on said top surface of said substrate and having:
a first hole formed above and at least partially aligned with the source region of the JFET and filled with polysilicon to form a source contact;
a second hole formed above and at least partially aligned with the drain region of the JFET and filled with polysilicon to form a drain contact; and
a third hole formed above and at least partially aligned with the gate region of the JFET and filled with polysilicon to form a gate contact; and
a nitride layer formed on top of said layer of insulating material;
wherein:
the polysilicon filling said holes in said insulating material has a surface that is coplanar with a surface of the nitride layer;
the polysilicon forming the gate contact is doped to the first conductivity type;
the polysilicon forming the source contact is doped to the second conductivity type; and
the polysilicon forming the drain contact is doped to the second conductivity type.

4. The apparatus of claim 3 further comprising a layer of nitride formed on said top surface of said substrate under said layer of insulating material formed on said top surface of said substrate and over said area of insulating material formed in said substrate to define said active area, and wherein said layer of insulating material formed on said top surface of said substrate being silicon dioxide.

5. An integrated, normally-off Junction Field Effect Transistor (JFET) comprising:
a substrate having at least a portion thereof made of semiconductor and having a top surface;
a well region formed in said semiconductor portion of said substrate and doped to a first conductivity type;
an insulating material formed in said semiconductor portion of said substrate so as to form an active region in said semiconductor portion of said substrate in which the normally-off JFET is formed;
a conductive channel region formed in said active region and doped to a second conductivity type;
a conductive gate region formed in said channel region and doped to said first conductivity type;
a conductive source region formed in said channel region and doped to said second conductivity type;
a conductive drain region formed in said channel region and doped to said second conductivity type;
a layer of insulating material formed on said top surface of said substrate and having:
a first hole formed above and at least partially aligned with the source region of the JFET and filled with polysilicon to form a source contact;
a second hole formed above and at least partially aligned with the drain region of the JFET and filled with polysilicon to form a drain contact; and
a third hole formed above and at least partially aligned with the gate region of the JFET and filled with polysilicon to form a gate contact; and
a nitride layer formed on top of said layer of insulating material so as to not block access to said source, drain and gate regions;
wherein:
the polysilicon forming the gate contact has a surface that is coplanar with a surface of the nitride layer;
the polysilicon forming the source contact has a surface that is coplanar with a surface of the nitride layer; and
the polysilicon forming the drain contact has a surface that is coplanar with a surface of the nitride layer.

* * * * *

UNITED STATES PATENT AND TRADEMARK OFFICE
CERTIFICATE OF CORRECTION

| | | |
|---|---|---|
| PATENT NO. | : 7,642,566 B2 | Page 1 of 1 |
| APPLICATION NO. | : 11/451886 | |
| DATED | : January 5, 2010 | |
| INVENTOR(S) | : Madhukar B. Vora et al. | |

It is certified that error appears in the above-identified patent and that said Letters Patent is hereby corrected as shown below:

On the Title page, Item (54) and at Column 1, line 1, in the title, after "STRUCTURE", delete "OF" and insert --FOR--.

This certificate supersedes the Certificate of Correction issued March 9, 2010.

Signed and Sealed this

Thirtieth Day of March, 2010

David J. Kappos
*Director of the United States Patent and Trademark Office*